(12) United States Patent
Lai et al.

(10) Patent No.: US 7,643,258 B2
(45) Date of Patent: *Jan. 5, 2010

(54) METHODS AND APPARATUS FOR ELECTROSTATIC DISCHARGE PROTECTION IN A SEMICONDUCTOR CIRCUIT

(75) Inventors: Chun-Hsiang Lai, Taichung (TW); Chia-Ling Lu, Taipei (TW)

(73) Assignee: Macronix International Co., Ltd. (TW)

( * ) Notice: Subject to any disclaimer, the term of this patent is extended or adjusted under 35 U.S.C. 154(b) by 362 days.

This patent is subject to a terminal disclaimer.

(21) Appl. No.: 11/426,513

(22) Filed: Jun. 26, 2006

(65) Prior Publication Data

US 2006/0268478 A1 Nov. 30, 2006

Related U.S. Application Data

(63) Continuation-in-part of application No. 11/141,284, filed on May 31, 2005, now Pat. No. 7,087,968.

(60) Provisional application No. 60/748,995, filed on Dec. 9, 2005.

(51) Int. Cl.
*H02H 9/00* (2006.01)
(52) U.S. Cl. ...................................................... 361/56
(58) Field of Classification Search .................... 361/56
See application file for complete search history.

(56) References Cited

U.S. PATENT DOCUMENTS

| 5,572,394 A | * | 11/1996 | Ker et al. | 361/56 |
|---|---|---|---|---|
| 6,011,681 A | * | 1/2000 | Ker et al. | 361/111 |
| 6,144,542 A | * | 11/2000 | Ker et al. | 361/111 |
| 2004/0100746 A1 | * | 5/2004 | Chen et al. | 361/56 |

* cited by examiner

*Primary Examiner*—Stephen W Jackson
*Assistant Examiner*—Scott Bauer
(74) *Attorney, Agent, or Firm*—Baker & McKenzie LLP (57) ABSTRACT

An ESD protection circuit is adapted for an integrated circuit with a first power source and a second power source. The ESD protection circuit comprises a first silicon controlled rectifier (SCR), and in some embodiments a second silicon controlled rectifier, and a parasitic diode. The silicon rectifiers as well as the parasitic diode can all be formed using a single well formed in a substrate. Further, the ESD protection circuit can be used in systems that have multiple power sources regardless of the difference in voltage between the power sources.

19 Claims, 11 Drawing Sheets

METHODS AND APPARATUS FOR ELECTROSTATIC DISCHARGE PROTECTION IN A SEMICONDUCTOR CIRCUIT

RELATED APPLICATIONS INFORMATION

This application claims priority under 35 U.S.C. 119(e) to U.S. Provisional Application Ser. No. 60/748,995, entitled "ESD Protection Circuit For Mixed Voltage Multi-Power ICs," filed Dec. 9, 2005, and which is incorporated herein by reference as if set forth in full. This application also claims priority as a continuation-in-part under 35 U.S.C. 120 to U.S. patent Ser. No. 11/141,284, entitled "Electrostatic Discharge Protection Circuit and Semiconductor Circuit Therewith," filed May 31, 2005, now U.S. Pat. No. 7,087,968, which is also incorporated herein by reference as if set forth in full.

BACKGROUND

1. Field of the Invention

The present invention relates to a protection circuit, and more particularly, to an electrostatic discharge (ESD) protection circuit.

2. Background of the Invention

In order to save power, semiconductor circuits require lower and lower operating voltage. As the operating voltages get lower, the effect of electrostatic noise voltages increases. If not curbed, the relatively high electrostatic noise voltages can damage the semiconductor circuits during operation. Accordingly, protection circuits are included in most semiconductor circuits to prevent such damage.

Figure 1A:
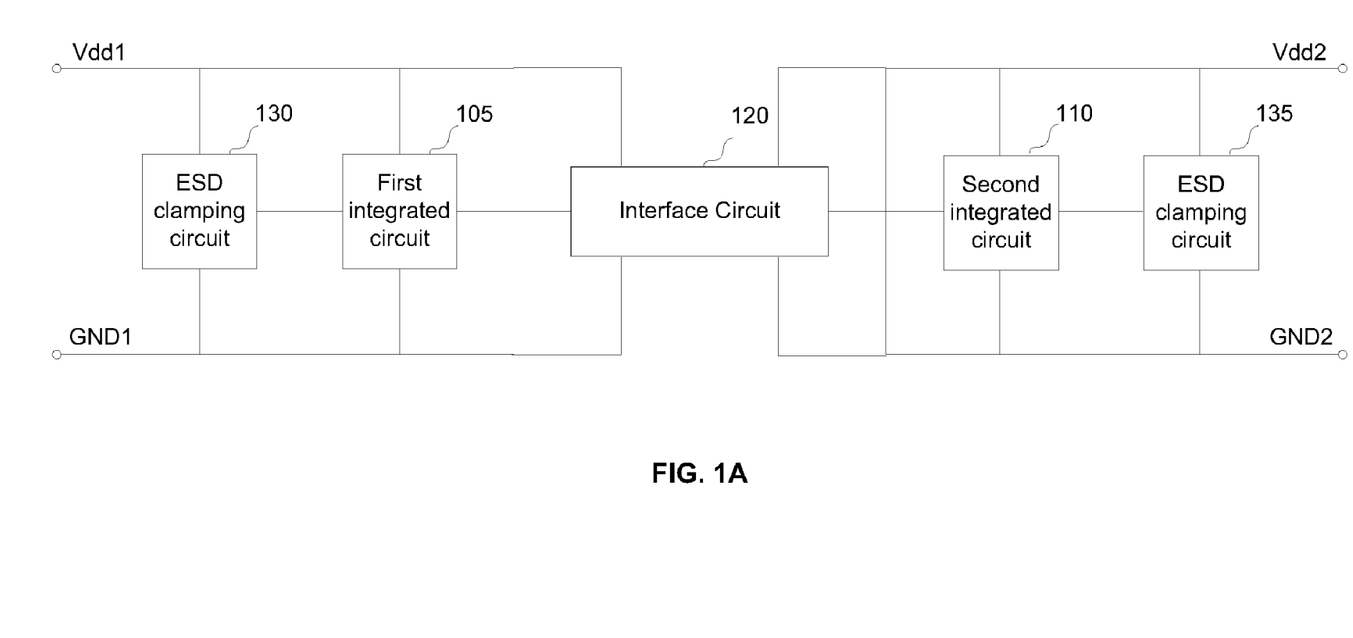
FIG. 1A is a schematic block circuit diagram showing a conventional ESD protection circuit structure.

FIG. 1A is a schematic diagram illustrating an example ESD protection circuit structure. Referring to FIG. 1A, the ESD protection circuit structure comprises two ESD protection clamping circuit 130 and 135. The circuit, or circuits to be protected include the integrated circuits 105 and 110, and the interface circuit 120 between the integrated circuits 105 and 110.

The integrated circuit 105 is coupled to the first power source Vdd1 and the first ground terminal GND1. The integrated circuit 110 is coupled to the second power source Vdd2 and the second ground terminal GND2. The interface circuit 120 is configured to interface the first integrated circuit 105 with the second integrated circuit 110 and is electrically coupled to the first power source Vdd1, the first ground terminal GND1, the second power source Vdd2, and the second ground terminal GND2.

If the first power source Vdd1 has an electrostatic noise voltage, then theoretically, the ESD clamping circuit 130 is immediately turned on. The current generated from the electrostatic noise voltage then flows to the first ground terminal GND1 through the ESD clamping circuit 130. Similarly, if the second power source Vdd2 has an electrostatic noise voltage, then the ESD clamping circuit 135 is immediately turned on. The current generated from the electrostatic noise voltage flows to the second ground terminal GND2 through the ESD clamping circuit 135.

Because there is no connection between the Vdd buses and the GND buses, however, ESD current can flow through the interface circuit 120 during an ESD event, which can cause damage to the interface circuit 120. For example, if an ESD event occurs on Vdd1, then current can flow from Vdd1 through interface circuit 120 to the second ground terminal GND2. Similarly, if the second power source Vdd2 experiences an ESD event, then ESD current can flow from the second power source Vdd2 through interface circuit 120 to the first ground terminal GND1. This problem can be overcome by the ESD protection circuit structure illustrated in FIG. 1B.

Figure 1B:
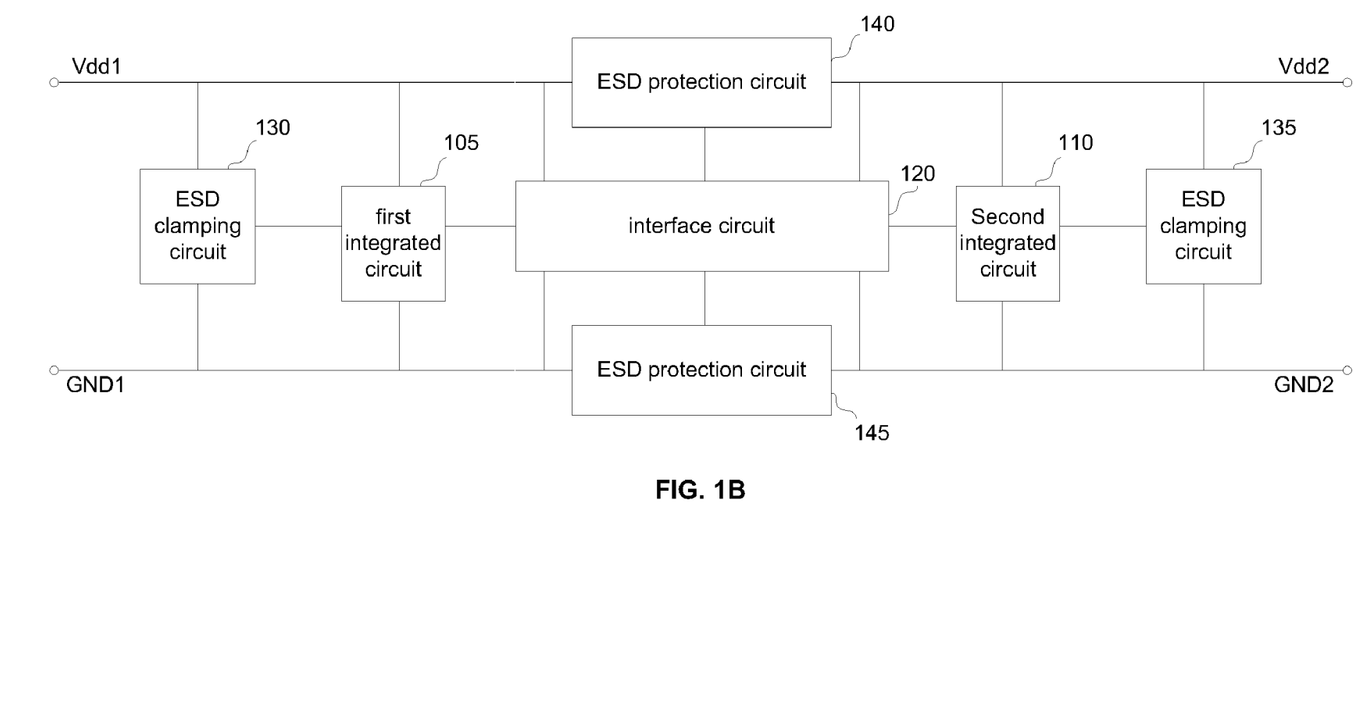
FIG. 1B is a schematic block circuit diagram showing an ESD protection circuit structure.

FIG. 1B is a schematic block circuit diagram showing another example ESD protection circuit structure. Referring to FIG. 1B, the ESD protection circuit structure comprises two ESD protection clamping circuits 130 and 135, and two ESD protection circuits 140 and 145. Wherein, the circuit to be protected includes the integrated circuits 105 and 110, and the interface circuit 120 between the integrated circuits 105 and 110. The ESD protection circuits 140 and 145 are circuits having the same function.

The integrated circuit 105 is coupled to the first power source Vdd1 and the first ground terminal GND1. The integrated circuit 110 is coupled to the second power source Vdd2 and the second ground terminal GND2. The interface circuit 120 is configured to interface the first integrated circuit 105 with the second integrated circuit 110 and is electrically coupled to the first power source Vdd1, the first ground terminal GND1, the second power source Vdd2, and the second ground terminal GND2.

If the first power source Vdd1 experiences an electrostatic noise voltage, then theoretically, the ESD clamping circuit 130 and the ESD protection circuit 140 are immediately turned on. The current generated from the electrostatic noise voltage then flows to the first ground terminal GND1 and to the second power source Vdd2 through the ESD clamping circuit 130 and the ESD protection circuit 140 such that the ESD noise current will not flow through and damage the integrated circuit 105 and/or the interface circuit 120.

Similarly, if the second power source Vdd2 has an electrostatic noise voltage, then the ESD clamping circuit 135 and the ESD protection circuit 140 are immediately turned on. The current generated from the electrostatic noise voltage flows to the second ground terminal GND2 and to the first power source Vdd1 through the ESD clamping circuit 135 and the ESD protection circuit 140, such that the ESD noise current will not flow through and damage the integrated circuit 110 and the interface circuit 120.

Figure 1C:
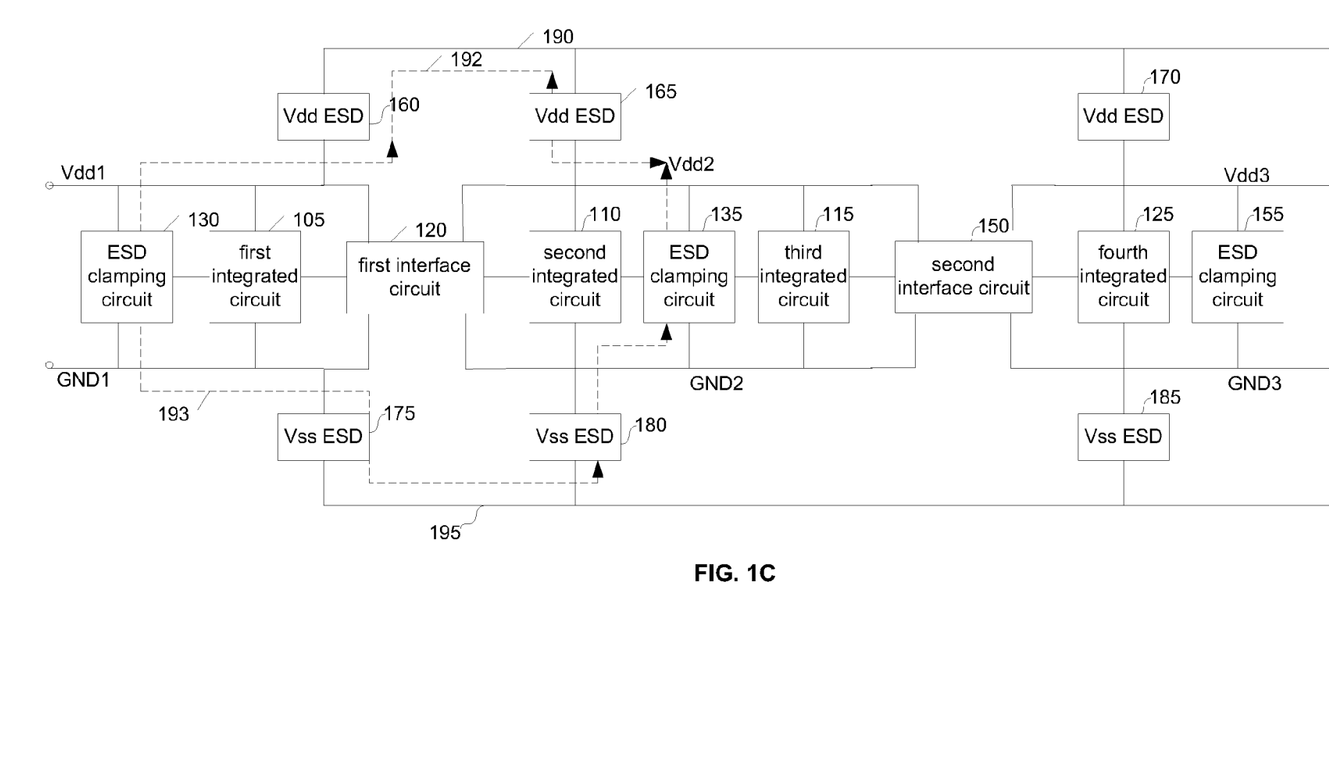
FIG. 1C is a schematic block circuit diagram showing another conventional ESD protection circuit structure.

Unfortunately, with the design of FIG. 1B, if the number of power supply sources becomes large, then additional connections between power sources and ground terminals are required and the design becomes much more complicated. Accordingly, when the number of the power sources exceeds 2, such as in the structure illustrated in FIG. 1C, then a common power supply ESD bus 190, and a common ground terminal ESD bus 195 can be required. Referring to FIG. 1C, the ESD protection circuit structure comprises three ESD protection clamping circuits 130, 135, and 155, and six ESD protection circuits 160, 165, 170, 175, 180 and 185. The circuits to be protected include the integrated circuits 105, 110, 115, and 125, and the interface circuits 120 and 150 configured to interface the integrated circuits 105, 110, 115, 125.

The integrated circuit 105 is coupled to the first power source Vdd1 and the first ground terminal GND1. The integrated circuit 110 is coupled to the second power source Vdd2 and the second ground terminal GND2. The third integrated circuit 115 is also coupled to the second power source Vdd2 and the second ground terminal GND2. The fourth integrated circuit 125 is coupled to the third power source Vdd3 and the third ground terminal GND3. The interface circuit 120 is electrically coupled to the first power source Vdd1, the first ground terminal GND1, the second power source Vdd2, and the second ground terminal GND2. The second interface circuit 150 is electrically coupled to the second power source Vdd2, the second ground terminal GND2, the third power source Vdd3, and the third ground terminal GND3. The ESD clamping circuits 130, 135, and 155, and the ESD protection circuits 160, 165, 170, 175, 180 and 185, act to protect the integrated circuits 105, 110, 115 and 125, and the interface circuits 120 and 150 in the event of an ESD event on one or more of the power sources Vdd1, Vdd2, and Vdd3. For example, if an ESD event occurs on the first power source Vdd1, then ESD clamping circuit 130 and ESD protection circuit 160 are immediately turned on. The current generated from the ESD event then flows to the first ground terminal GND1 and to the second power source Vdd2 through the ESD clamping circuit 130 and 135, and through the ESD protection circuits 160, 165, 175, and 180. Thus dashed lines 192 and 193 illustrate the flow of current in the event of an ESD event on first power source Vdd1.

Similarly, if an ESD event occurs on second power source Vdd2 or third power source Vdd3, then the ESD clamping circuits 130, 135, and 155 and the ESD protection circuits 160, 165, 170, 175, 180, and 185 would act to protect integrated circuits 105, 110, 115, and 125, and interface circuits 120 and 150 by passing the resulting ESD current around these circuits through the ESD clamping and protection circuits. It will be understood that the ESD buses can be extended in circuits comprising more than three power sources and ground terminals; however, as mentioned, the structure illustrated in FIG. 1C becomes more and more complicated, and requires more area at higher cost, as the number of power supply sources and ground terminals increases.

Often, back-to-back diode strings are used for ESD protection circuits 160, 165, 170, 175, 180, and 185. Back-to-back diode strings provide an easy and effective connection between power sources and ground terminals and the associated ESD bus, e.g. ESD bus 190 and/or 195. Unfortunately, when back-to-back diode strings are used to connect multiple power sources with an ESD bus, such as ESD bus 190, large leakage current can occur when there is a difference between the power supply voltage levels, especially at high temperature. This leakage current will increase power consumption, and in portable devices reduce battery life times. Another issue can be noise coupling that can result when back-to-back diode strings are used.

Accordingly, in other applications, the ESD protection circuits can comprise silicon controlled rectifiers (SCRs) in a back-to-back configuration. SCRs are characterized by low operating voltage and low power. The SCRs include lateral SCRs (LSCRs), and low-voltage trigger SCRs (LVTSCRs).

Figure 2:
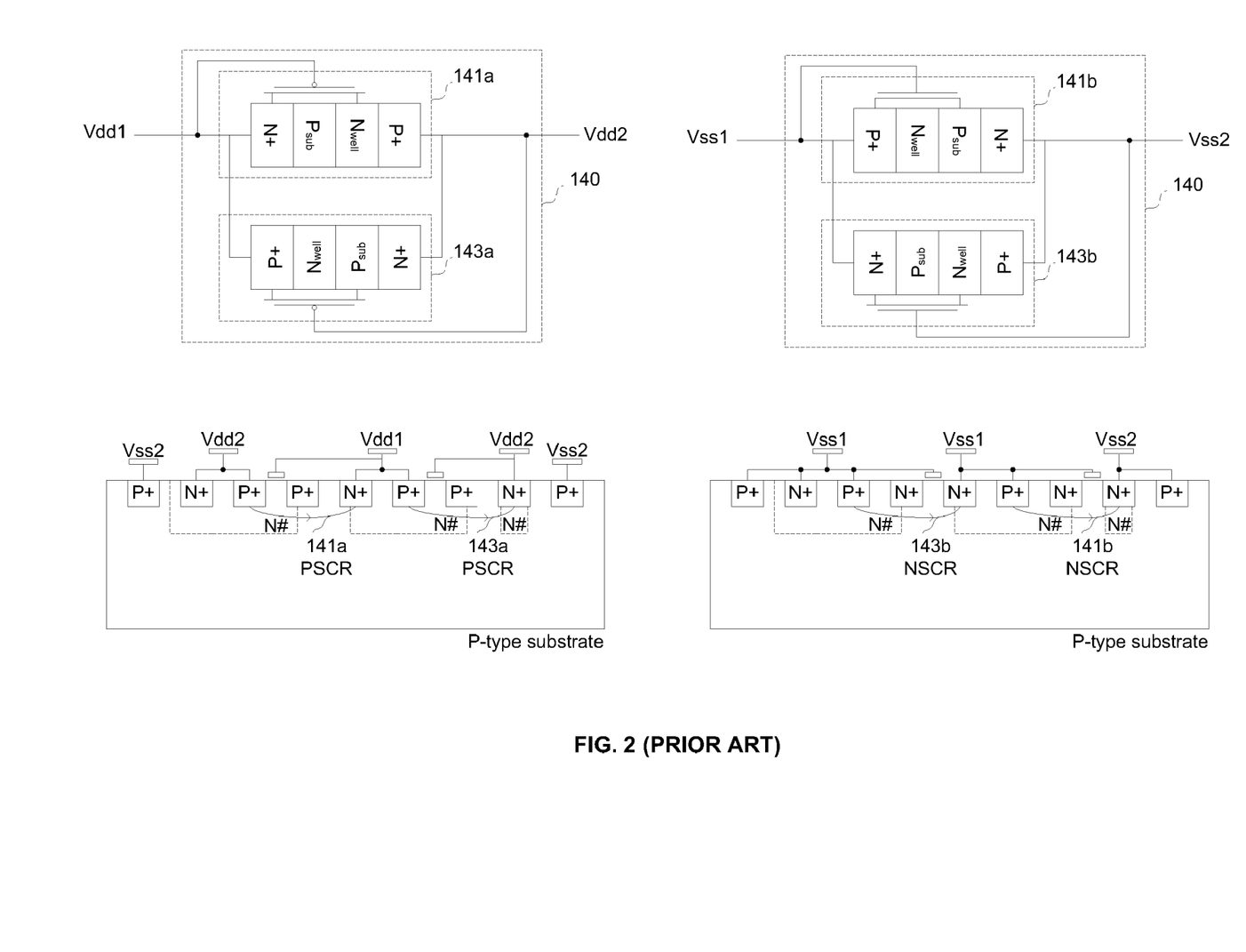
FIG. 2 is schematic block circuit and cross-sectional configurations showing a conventional ESD protection circuit of FIG. 1.

FIG. 2 is schematic block circuit and cross sectional configurations showing a conventional SCR ESD protection circuit. Here the SCR is a LSCR. The LSCR comprises a positive-channel metal-oxide-semiconductor (PMOS) transistor and an N-well region. Such an SCR can be referred to as a P-type SCR (PSCR). In another example, the LSCR may comprise a negative-channel metal-oxide-semiconductor (NMOS) transistor and a P-well region, which can be referred to as a N-type SCR (NSCR). In order to illustrate the operating theory, an equivalent PMOS transistor diagram is added in the left configuration of FIG. 2, and an equivalent NMOS transistor diagram is added in the right configuration of FIG. 2. These two circuits in FIG. 2 have the same function.

The circuit in the left configuration of FIG. 2 comprises two PSCRs 141a and 143a, wherein the control gate of the PMOS transistor of the PSCR 141a is coupled to the first power source Vdd1, and the control gate of the PMOS transistor of the PSCR 143a is coupled to the second power source Vdd2. Other connection specifics are shown in FIG. 2. While the first power source Vdd1 generates a higher positive electrostatic voltage noise, at this moment the voltage difference between the control gate of the PMOS transistor and the anode (the source of the PMOS transistor) of the PSCR 143a is higher than the threshold voltage of the PMOS transistor. Accordingly, a current path is generated and the first and the second power sources Vdd1 and Vdd2 are connected through the PSCR 143a. Usually, the threshold voltage is 0.4~2V. For simple descriptions, all threshold voltages described below are 1V unless otherwise specified.

Accordingly, while the second power source Vdd2 generates a higher electrostatic voltage noise, at this moment, the voltage difference between the control gate of the PMOS transistor and the anode (the source of the PMOS transistor) of the PSCR 141a, is higher than the threshold voltage, about 1V, of the PMOS transistor. Accordingly, a current path is generated and the first and the second power sources Vdd1 and Vdd2 are connected through the PSCR 141a such that the current generated from the electrostatic noise voltage will not damage internal circuits.

The circuit in the right configuration of FIG. 2 comprises two NSCRs 141b and 143b, wherein the control gate of the NMOS transistor of the NSCR 141b is coupled to the power source Vss2, and the control gate of the NMOS transistor of the NSCR 143b is coupled to the power source Vss1. Other connection specifics in the circuit are shown in FIG. 2. The source voltages Vss1 and Vss2 are similar to the first and the second power sources Vdd1 and Vdd2. When the power source Vss1 generates a higher positive electrostatic voltage noise, at this moment, the voltage difference between the control gate of the NMOS transistor and the cathode (the source of the NMOS transistor) of the NSCR 141b is higher than the threshold voltage, about 1V, of the NMOS transistor. Accordingly, a current path is generated and the power sources Vss1 and Vss2 are connected through the NSCR 143b such that the current generated from the electrostatic voltage noise will not damage internal circuits. The operating theory of the NSCR 141b is similar to that of the NSCR 143b. Detailed descriptions are not repeated.

Accordingly, in a conventional ESD protection circuit that uses back-to-back SCRs, when the voltage difference between the first power source Vdd1 and the second power source Vdd2 is larger than 1V, the ESD protection circuit is turned on so that, e.g., the integrated circuits 105 and 110, cannot receive correct data from external circuits. Therefore, only when the voltage difference between the first and the second power sources is lower than 1V can the conventional ESD protection circuit be used, or only when multiple ESD protection circuits are connected in series so that the voltage difference between the first and the second power sources is higher than 1V. This limit complicates the design of the circuit. In addition, the series connection of ESD protection circuits will increase area and costs.

For example, referring to the structure configuration of FIG. 2, the control gate of the PSCR 141a is coupled to the first power source Vdd1, and the control gate of the PSCR 143a is coupled to the second power source Vdd2. As a result, N-well regions of these PSCRs 141a and 143a must be separated, and cannot be a same N-well. The structure of NSCRs 141b and 143b has the same issue. This would increase the layout area of the circuit and increase costs.

SUMMARY

An electrostatic discharge (ESD) protection circuit, wherein the circuits can be designed regardless of the voltage difference between the first power source and the second power source.

In one aspect, the ESD protection circuit is capable of reducing the layout area of the circuit and the manufacturing costs.

In another aspect, the ESD protection circuit is adopted for an integrated circuit with a plurality of power sources and an ESD bus, the protection circuit comprising a first silicon controlled rectifier, a parasitic diode, and a soft pull-up, or soft pull-down circuit. The first silicon controlled rectifier comprises a first metal oxide semiconductor transistor, where in an anode of the first silicon controlled rectifier is coupled to the first power source and an anode of the first silicon controlled rectifier is coupled to an ESD bus. An anode of the parasitic diode is coupled to the ESD bus and a cathode of the parasitic diode is coupled to the first power source.

In another aspect, the ESD protection circuit is adapted for an integrated circuit with a plurality of power sources and an ESD bus, the protection circuit comprising a first silicon controlled rectifier, a second silicon controlled rectifier, and a parasitic diode. The first silicon controlled rectifier comprises a first metal-oxide-semiconductor transistor. Wherein, an anode of the first silicon controlled rectifier is coupled to the first power source, and a cathode of the first silicon controlled rectifier is coupled to the ESD Bus. The second silicon controlled rectifier also comprises a second metal-oxide-semiconductor transistor. Wherein, an anode of the second silicon controlled rectifier is coupled to the first power source, a cathode of the second silicon controlled rectifier is coupled to the ESD bus, and gates of the first and the second metal-oxide-semiconductor transistors are coupled to the first power source. An anode of the parasitic diode is coupled to the ESD bus, and a cathode of the parasitic diode is coupled to the first power source.

According to another aspect, the first power source is a high power sources (Vdd), and the first and the second metal-oxide-semiconductor transistors are P-type transistors and the gates thereof are coupled to the power source. The ESD protection circuit then further comprises a signal delay unit electrically coupled between the power source and the gate of the P-typed second metal-oxide-semiconductor transistor.

According to another aspect, the first power source is a low power source (Vss), and the first and the second metal-oxide-semiconductor transistors are N-type transistors and the gates thereof are coupled to the power source. Then, the ESD protection circuit further comprises a signal delay unit electrically coupled between the ESD bus and the gate of the N-type first metal-oxide-semiconductor transistor.

The signal delay unit described above is a circuit composed of a resistor, or a circuit or a transmission gate composed of a resistor and a capacitor.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

Figure 3A:
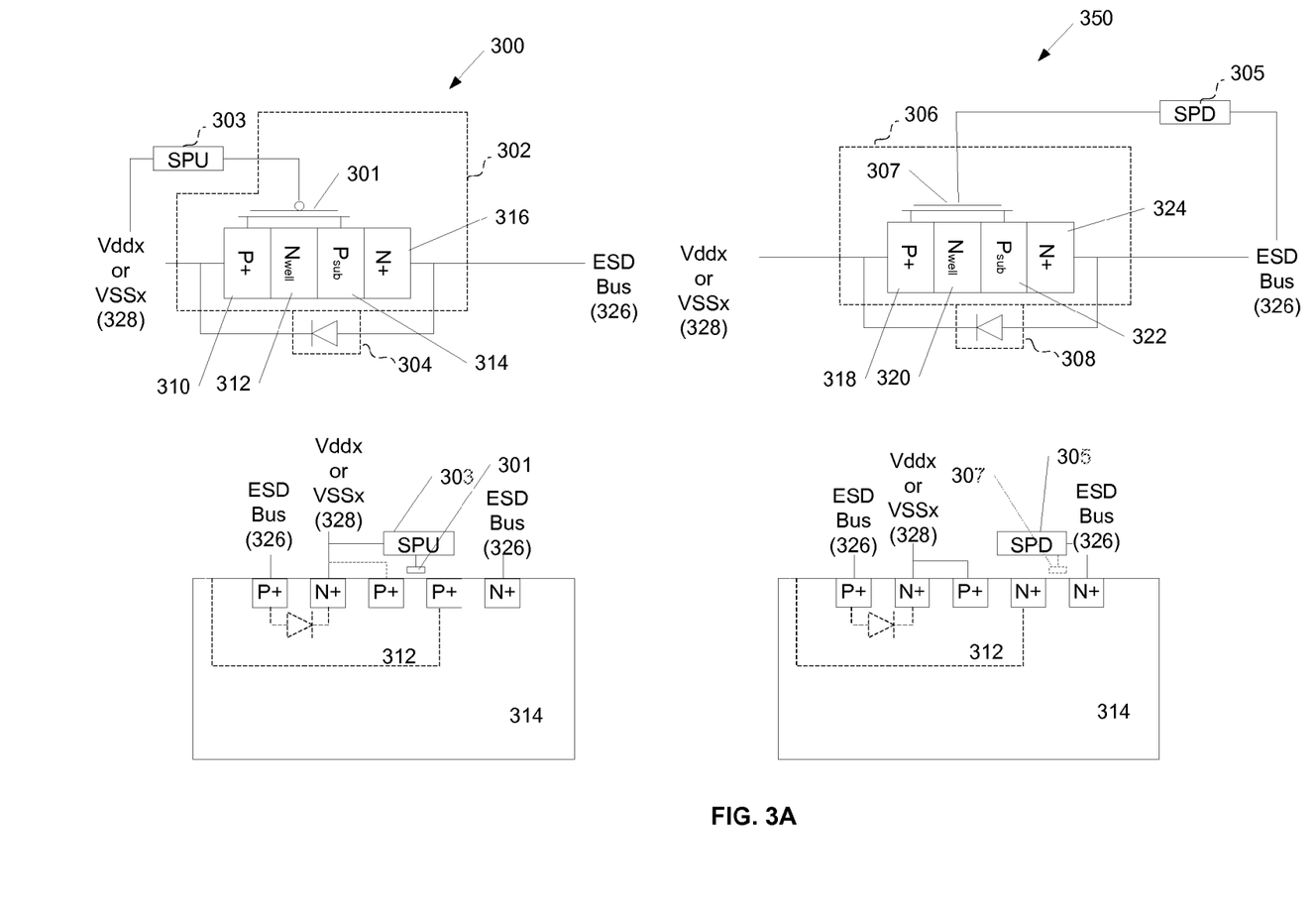
FIG. 3A is schematic configurations showing circuit block diagrams in cross-sectional structures and an electrostatic discharge (ESD) protection circuit according to one embodiment.

FIG. 3A is schematic configurations showing circuit block diagrams and cross sectional structures of an electrostatic discharge (ESD) protection circuit according to one embodiment. In order to further illustrate the operating principles of the embodiment illustrated in FIG. 3A, an equivalent PMOS transistor diagram is added in the left configurations 300 of FIG. 3A, and an equivalent NMOS diagram is added in the right configurations 350 of FIG. 3A. Circuit 300 can be said to include a P-type SCR (PSCR) 302. ESD protection circuit 350 on the right hand side of FIG. 3A can be said to include an N-type SCR (NSCR) 306. The circuits on the left and right hand side of FIG. 3A operate principally in the same manner. Accordingly, the following description is related to the operation of ESD protection circuit 300 on the left hand side.

Referring to the diagram in the upper left of FIG. 3A, it can be seen that circuit 300 is formed on a substrate 314, such as a P-type substrate. A well 312 is then formed in substrate 314. For example, an N-type well 312 is formed in a P-type substrate 314. Doped regions 310 and 316 are then formed in substrate 314 and well 312 to form ESD protection circuit 300. Further, P+ and N+ doped regions are then formed in and out of N well 312 as illustrated in the lower half of the left side of FIG. 3A.

N+ doped region 316 act as the Cathode of PSCR 302 and is connected to ESD bus 326. P+ doped region 310 acts as the anode for PSCR 302 and is coupled with a power source or a ground terminal (e.g., a VSS source) 328. As can be seen on the bottom left hand side of FIG. 3A, additional doped regions are included both inside and outside of N well 312. A gate structure 301 is then formed over substrate 314 between two of the doped regions formed inside and out of N well 312.

Anode 310 of PSCR 302 can, e.g., be coupled with a first power source Vdd1, and Cathode 316 of PSCR 302 can be coupled to ESD bus 326. Control gate 301 of the PMOS transistor of PSCR 302 can also be coupled to the first power source, e.g., power source Vdd1. As will be discussed below, gate 301 can be coupled to the first power source through a delay circuit, such as soft pull up circuit 303. The anode of reverse directional diode 304 can then be coupled to ESD bus 326, while the cathode of reverse directional diode 304 is coupled with the first power source 328.

As explained below, PSCR 301 will actually work in conjunction with a reverse directional diode 304 include in another ESD protection circuit in the same semiconductor device to help couple an ESD voltage the originates on the first power source to a second power source and then to a second ground terminal.

Figure 3B:
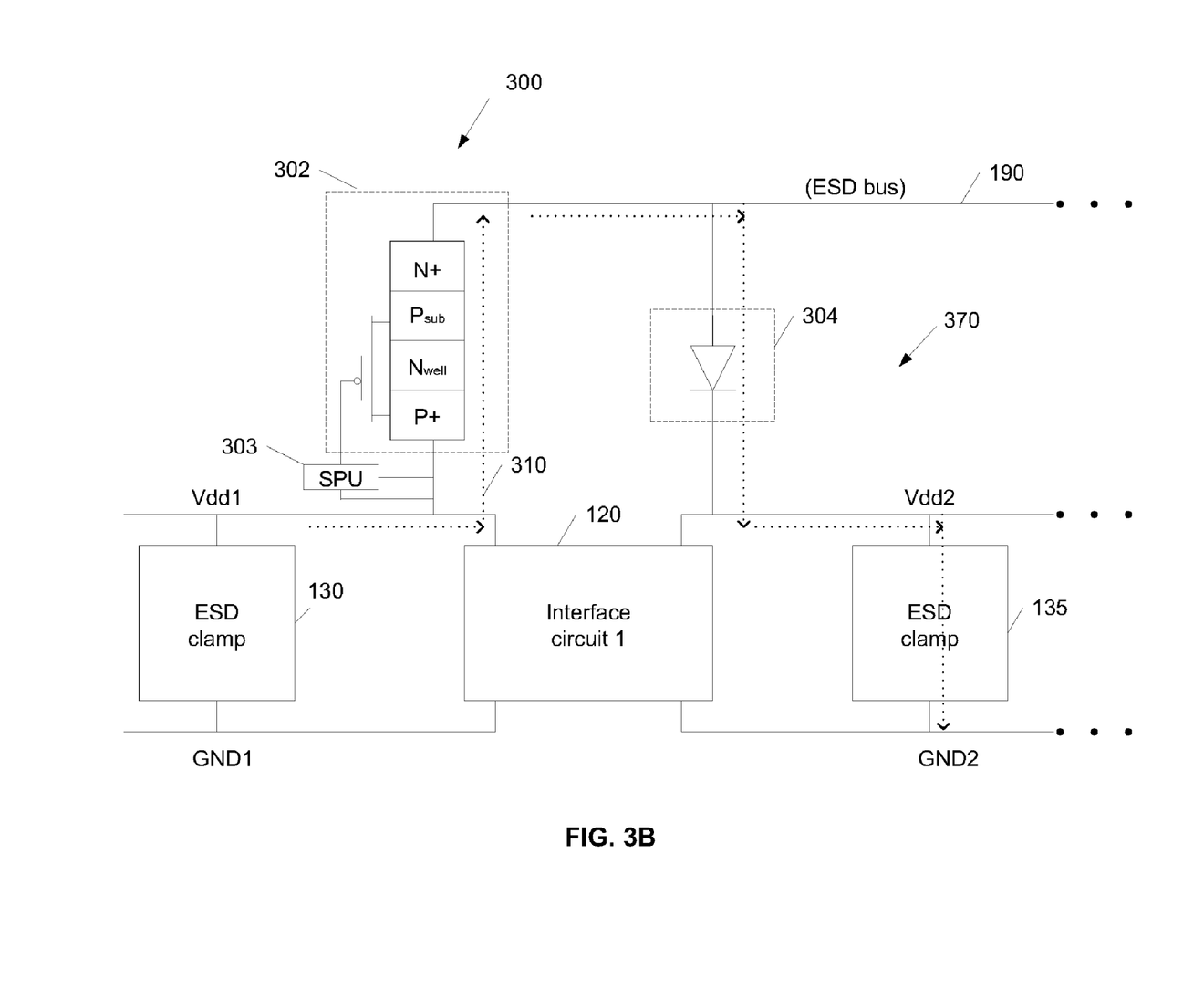
FIG. 3B is a diagram illustrating the ESD current path through the electrostatic discharge (ESD) protection circuit of FIG. 3.

The connection of ESD protection circuit 300 to the circuits illustrated in FIG. 1A is illustrated in FIG. 3B. The integrated circuits 105 and 110 are left out for simplicity. Accordingly, as illustrated in FIG. 3B, PSCR 302 can be coupled between first power source Vdd1 and ESD bus 190. A reverse directional diode 304 included in another ESD protection circuit 360 can then be coupled between ESD bus 190 and second power source Vdd2. If an ESD event occurs on first power source Vdd1 and this event has an electrostatic noise voltage of a magnitude that is higher than the breakdown voltage of the PMOS transistor comprising PSCR 302, then the current generated after the breakdown of the PMOS transistor turns on PSCR 302. As a result, the current generated by the electrostatic noise voltage flows to the second power source Vdd2 through PSCR 302 and reverse directional diode 304 included in the other circuit 360 as illustrated by the dash line 310 in FIG. 3B. For example, the threshold voltage of PSCR 302 can be approximately 1V. If PSCR 302 turns on as the ESD noise voltage approaches 1V, then this should be sufficient to protect, e.g., interface circuit 120.

Because PSCR 302 is normally off, the voltage level of the power source, e.g., first power source Vdd1, can be higher than ESD bus 190 without generating larger leakage currents during normal operation. Further, because diode 304 can be formed in N-well 312, diode 304 occupies a very small area.

Soft pull up circuit 303, and soft pull down circuit 305 illustrated on the right hand side of FIG. 3A, couple the signal going from power source 328, e.g., power source Vdd1, or ESD bus 326 to gates 301 or 307 of PSCR 302 or NSCR 306 respectively, to turn off the SCRs during normal operation; however, soft pull up circuit 303, or soft pull down circuit 305, delay a signal coming from power source 328 or ESD bus 326 during an ESD event to speed up the turn on of PSCR 302, or NSCR 306.

Accordingly, when stressing, e.g., power source VDD1, with a positive ESD pulse, soft pull up circuit 303 illustrated in FIG. 3A will delay the signal, causing gate 301 of the PMOS transistor to be low thereby turning on the PMOS transistor. This will cause PSCR 302 to trigger faster. In other words, soft pull up circuit 303 can speed the turn on of PSCR 302 during an ESD event, but has little effect during normal operation. Soft pull down circuit 305 has the same effect for NSCR 306 illustrated on the right hand side of FIG. 3A.

Referring to FIG. 3B, the total voltage drop between first power source Vdd1 and second power source Vdd2 is the holding voltage of PSCR 302, which is about 1.5 volts, plus the forward bias voltage of diode 304, which is about 0.7 volts. Accordingly, the total voltage drop is typically about 2.2 volts during an ESD event. This voltage drop is low enough to avoid damage, e.g., to interface circuit 120. Further, because PSCR 302 is normally off, all of the power sources can be of different voltage levels.

Figure 4:
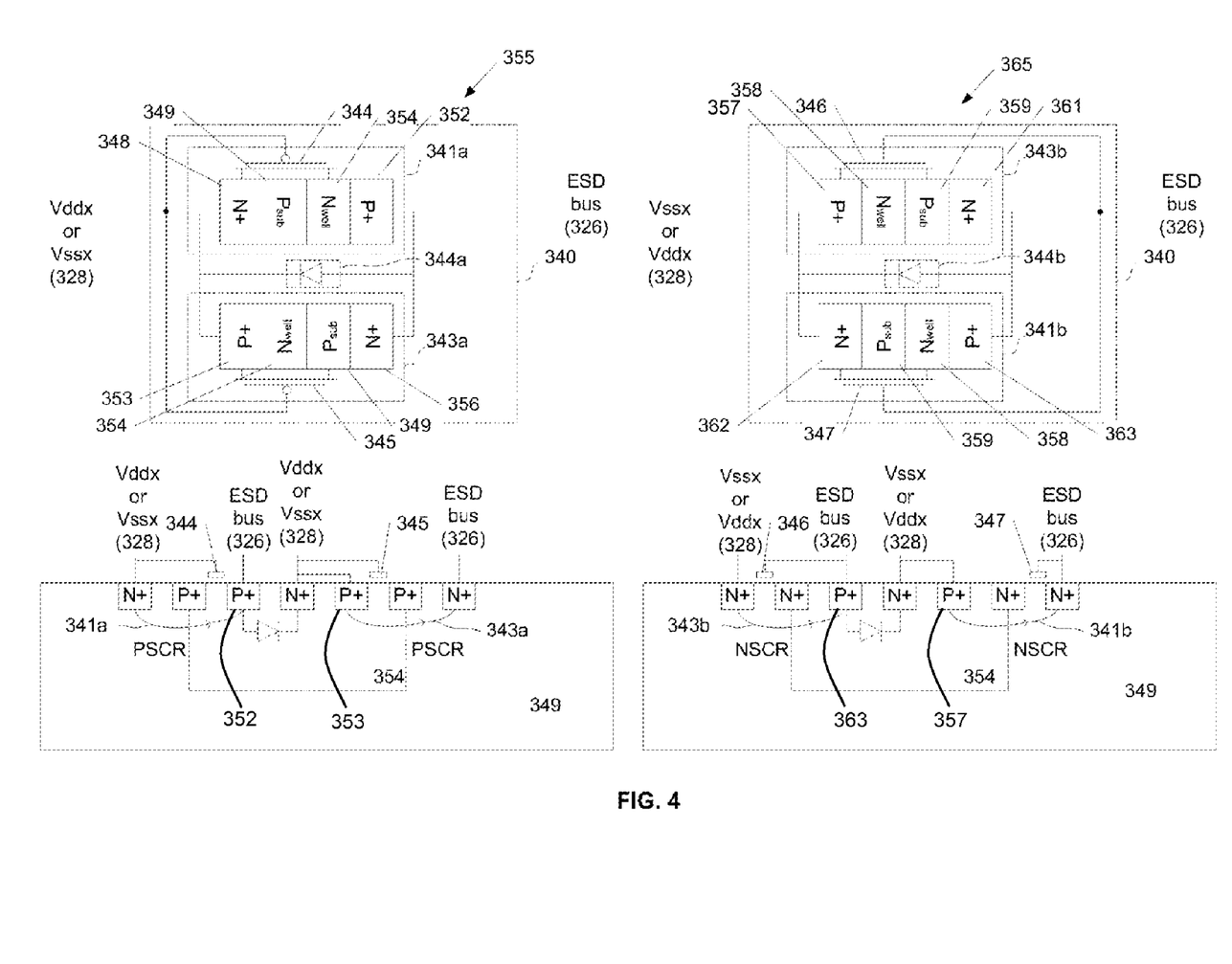
FIG. 4. is schematic configurations showing circuit block diagrams and cross sectional structures of an electrostatic discharge (ESD) protection circuit according to another embodiment.

FIG. 4 illustrates schematic configuration showing circuit block diagrams and cross-sectional structures for ESD protection configuration according to another embodiment. Circuit 355 on the left hand side of FIG. 4 includes two PSCRs 341a and 343a as well as a reverse directional diode 344a. Circuit 365 on the right hand side of FIG. 4 includes two NSCRs 341b and 343b as well as reverse directional diode 344b. In order to illustrate the operating principle of this embodiment, an equivalent PMOS transistor diagram is added in the left configurations of FIG. 4, and an equivalent NMOS diagram is added in the right configurations of FIG. 4.

Circuits 355 and 365 operate principally in the same manner. Accordingly, only circuit 355 on the left hand side of FIG. 3 will be described in detail below.

Referring to the left hand side of FIG. 4, circuit 355 comprises a first PSCR, such as a PLVTSCR 341a constructed on a substrate 349, such as a P-type substrate 349. A well 354 is then formed in substrate 349, e.g., if substrate 349 is a P-type substrate, then well 354 will be an N-well 354. Doped regions 348 and 352 can then be formed in substrate 349 and/or N-well 354. N+ region 348 acts as the cathode for PSCR 341a and is connected with a power supply or ground terminal 328. P+ doped region 352 acts as the anode of PSCR 341a and is coupled with ESD bus 326. PSCR 341a also comprises a PMOS transistor, a gate 344 of which is formed over substrate 349 and is also coupled with power source or ground terminal 328.

Circuit 355 also includes PSCR 343a formed on substrate 349 and N-well 354. P+ doped region 353 acts as the anode for PSCR 343A and is coupled with power supply or ground terminal 328. N+ doped region 356 acts as a cathode of PSCR 343a and is coupled with ESD bus 326. The anode of reverse directional diode 344a is coupled with ESD bus 326 and the cathode is coupled with a power supply or ground terminal 328.

As can be seen, PSCR 341a and 343a can be constructed in the same N-well 354, thus saving circuit area. Further, reverse directional diode 344a can be formed in N-well 354, which also acts to reduce area requirements.

In operation, PSCR 341a is coupled between a first power supply, e.g., Vdd1, and ESD bus 326. PSCR 341a then acts in conjunction with a reverse directional diode 344a and a PSCR 343a included in a separate ESD protection circuit. The anode of diode 344a and the cathode of PSCR 343a included in this other circuit are coupled with ESD bus 326, while the cathode of reverse directional diode 344a and the anode of PSCR 343a included in this other circuit are coupled with a second power supply, e.g., power supply Vdd2. If an ESD event occurs on power supply Vdd1, then this will cause PSCR 343a to turn on and allow the resulting ESD current to flow through PSCR 343a to ESD bus 326. This ESD current will then flow through reverse directional diode 344a and PSCR 341a included in the other circuit to the second power source Vdd2. This operation is illustrated in more detail with respect to FIG. 5B below.

Figure 5A:
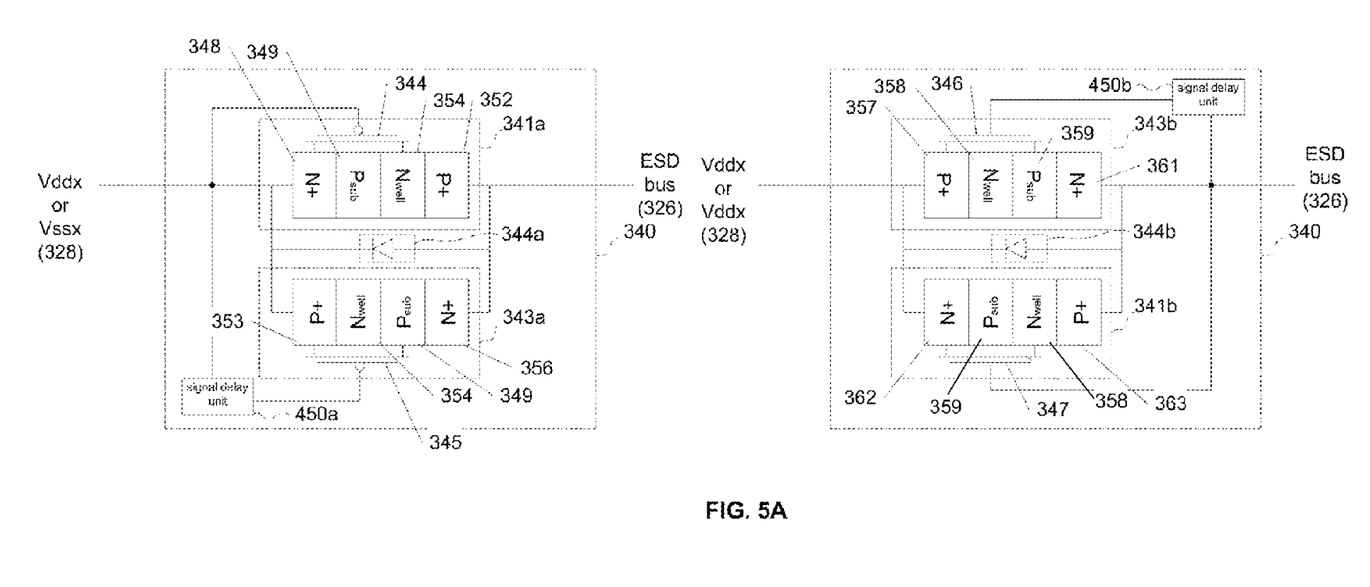
FIG. 5A is schematic configurations showing circuit block diagrams of an electrostatic discharge (ESD) protection circuit according to another embodiment.

FIG. 5A is a diagram illustrating circuit block diagrams for embodiments of ESD protection circuits 355 and 365 that include signal delay units 450a and 450b. Signal delay unit 450a can, e.g., be a soft pull-up circuit such as that described in FIG. 3a and in more detail below. As can be seen signal delay unit 450a is coupled between the gate 345 of the PMOS transistor included in PSCR and a power source or ground terminal 328. Signal delay unit 450b is coupled between gate 346 of the PMOS transistor included in SCR 343b and ESD bus 326.

Because by directional PSCRs 341a and 343a are normally off, the voltage level on the power supply or ground terminals 328 can be higher than the voltage on ESD bus 326 without generating large leakage currents during normal operation.

Figure 5B:
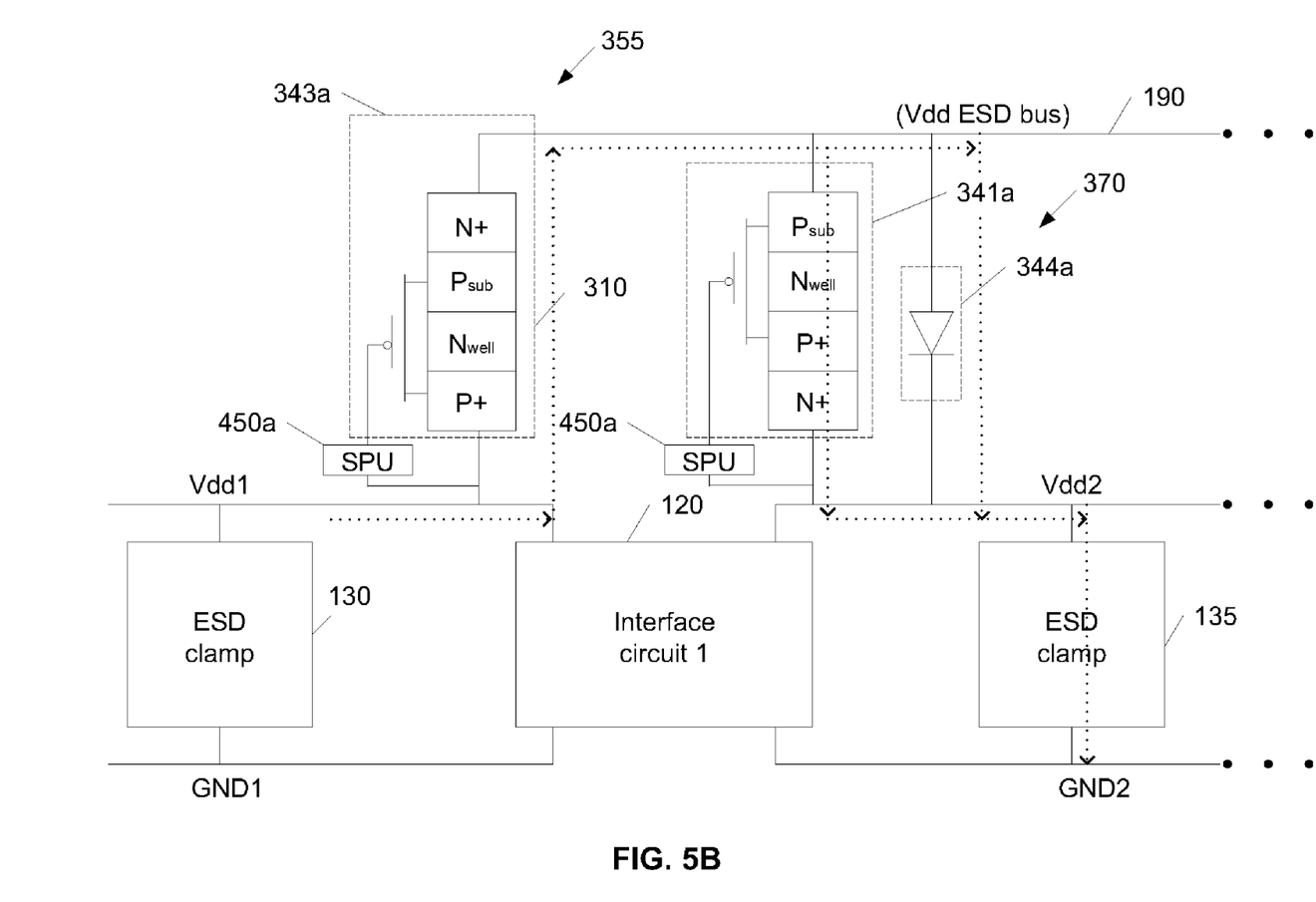
FIG. 5B is a diagram illustrating the ESD current path through the electrostatic discharge (ESD) protection circuit of FIG. 5.

With respect to FIG. 5B, one of PSCRs 341a and 343a will provide the path from power supply or ground terminal 328 to ESD bus 326, while the other combined with reverse directional diode 344a will provide the path from ESD bus 326 to a power source or ground terminal 328 during an ESD event. As a result, diode 344a does not necessarily need to be optimized, since it is working in conjunction with one of PSCRs 341a and 343a.

Signal delay unit 450a, e.g., soft pull-up circuit 450a keeps any signals on power supply or ground terminal 328, or in the case of signal delay unit 450b from ESD bus 326, from coupling with gate 345, or 346, during normal operation. During an ESD event, signal delay units 450a and 450b delay the signal reaching gates 345 or 346 in order to speed up the turn on of the associated SCR.

FIG. 5B is a diagram illustrating the operation of the ESD protection circuits illustrated in FIG. 5A. Here, PSCR 343a of circuit 355 is coupled between power source capital Vdd1 and ESD bus 190. If an ESD event occurs in Vdd1, then PSCR 343a will turn on and the ESD current generated by the ESD event will flow through PSCR 343a to ESD bus 190. This will cause PSCR 341a include another circuit 370 and coupled between ESD bus 190 and Vdd2 to turn on and allow the current of flow from ESD bus 190 to Vdd2. Additionally, reverse directional diode 344a will turn on and also conduct the ESD current from ESD bus 192 to Vdd2.

As explained above, ESD clamps 130 and 135 will also turn on allowing the ESD current to flow from Vdd1 to GND1 and from Vdd2 to GND2. Accordingly, the ESD current generated by the ESD event will flow to ground terminals GND1 and GND2 and around interface circuit 120, protecting interface circuit 120 during the ESD event.

Referring to FIG. 5B, the total voltage drop between first power source Vdd1 and second power source Vdd2 is the holding voltage of PSCR 341a, which is about 1.5 volts, plus the forward bias voltage of diode 344a, which is about 0.7 volts. Accordingly, the total voltage drop is typically about 2.2 volts during an ESD event. This voltage drop is low enough to avoid damage, e.g., to interface circuit 120. Further, because PSCR 343a is normally off, all of the power sources can be of different voltage levels.

It will be understood that NSCR device 365 operates in such the same manner as PSCR device 355 and at the current path illustrated by the dash line 310 in FIG. 5B will be the same for embodiments that use circuit 365.

Figure 8:
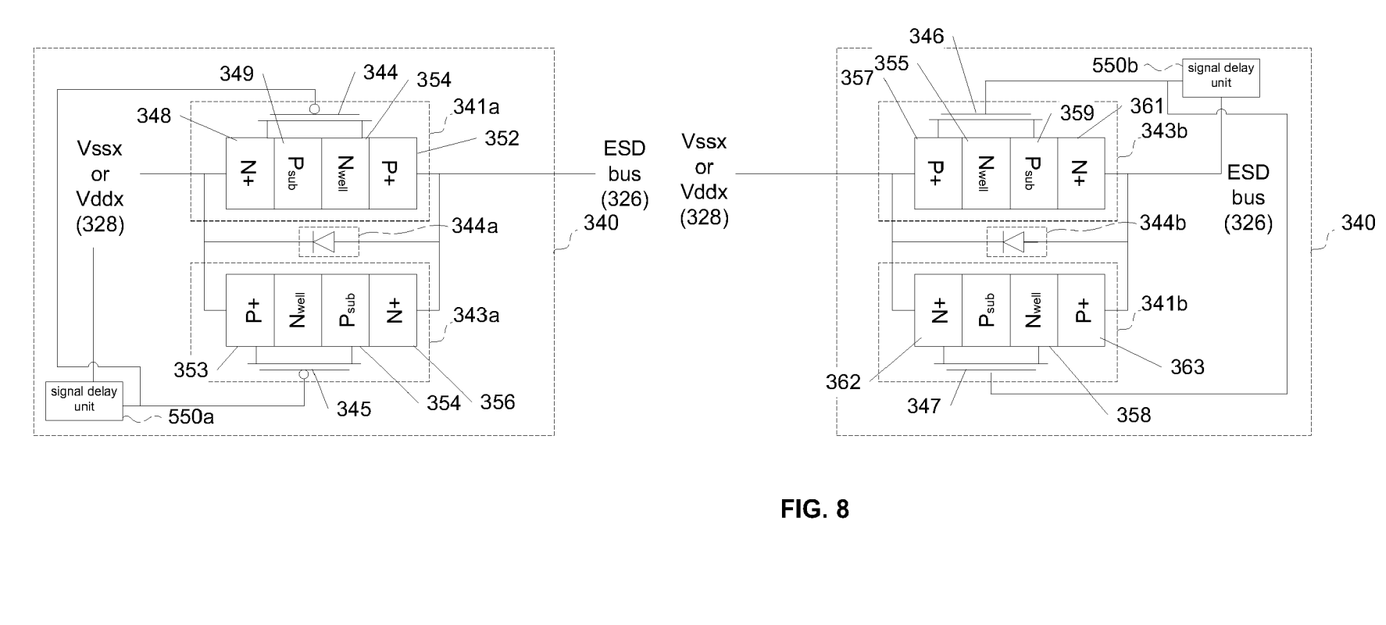
FIG. 8 is schematic configurations showing circuit block diagrams of an electrostatic discharge (ESD) protection circuit according to yet another embodiment.

FIG. 8 is a diagram illustrating a schematic configuration for another example ESD protection configuration in accordance with another embodiment. In FIG. 8, signal delay unit 550a is coupled between gate 345 of PSCR 343a and power source or ground terminal 328 as well as, between gate 344 of PSCR 341a and power source or ground terminal 328. Similarly, signal delay unit 550b is coupled between gate 346 of NSCR 343b and ESD bus 326, as well as between gate 347 of NSCR 341b and ESD bus 326. The operation principles for the embodiments illustrated in FIG. 8 are essentially the same as those discussed above with respect to FIG. 5B. Accordingly, the detailed discussion of the operation of the circuits in FIG. 8 will be omitted for the sake of brevity.

Figure 6:
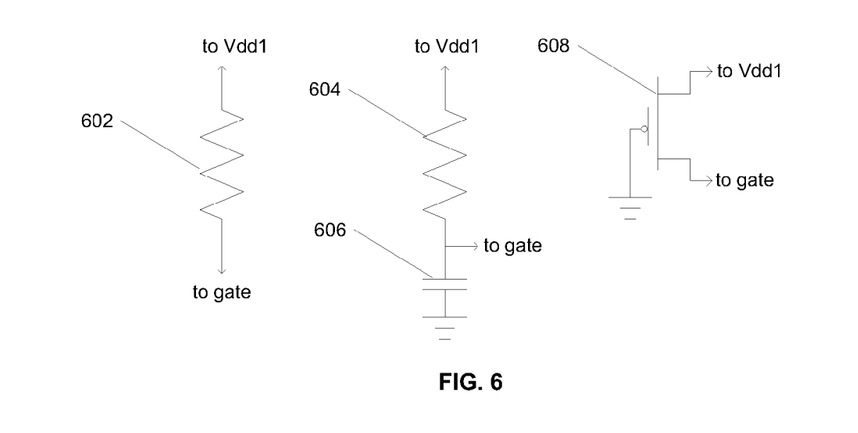
FIG. 6 is schematic drawings showing examples of a soft-pull-up unit circuit that can be included in the circuits of FIGS. 3, 4 and 5 according to certain embodiments.

FIG. 6 is a diagram illustrating example embodiments of soft pull-up circuit that can be used for delay circuits 303, 450a, or 550a in the embodiments described above. The purpose of signal delay units 303, 450a and 550a, is to delay the electrostatic noise voltage occurring between power source or ground terminal 328 and ESD bus 326. The electrostatic noise voltages are delayed from about hundreds of nanoseconds to about microseconds. When these electrostatic noise voltages are generated, the control gate, e.g., of the PMOS transistor included in PSCR 343a can be kept in a low voltage state in order to maintain a turn-on state for PSCR 343a.

An electrostatic noise voltage typically occurs for about hundreds of nanoseconds. Thus, signal delay units 303, 450a, and 550a electrically connect power source or ground terminal 328 with ESD bus 326, while the electrostatic noise voltage is occurring and for a period of time so that the electrostatic noise voltage can be transmitted there between. Accordingly, the associated ESD protection circuit can immediately remove the electrostatic noise voltage.

The delay time is so short that signal delay circuits 303, 450a and 550a can comprise just a single resistor 602. A single resistor of the appropriate value should be able to delay the noise for a sufficient amount of time. In other embodiments, a resistor capacitor circuit comprising resistor 604 and capacitor 606 can be used to modify the delay time based on the value of capacitor 606. In still other embodiments, a transmission gate 608 can be used to delay the signal. The signal is delayed via the resistor and parasitic capacitor included in transmission gate 608. Again, each of the embodiments illustrated in FIG. 6 can act as soft pull-up circuits for use in signal delay units 303, 450A, 550A.

Figure 7:
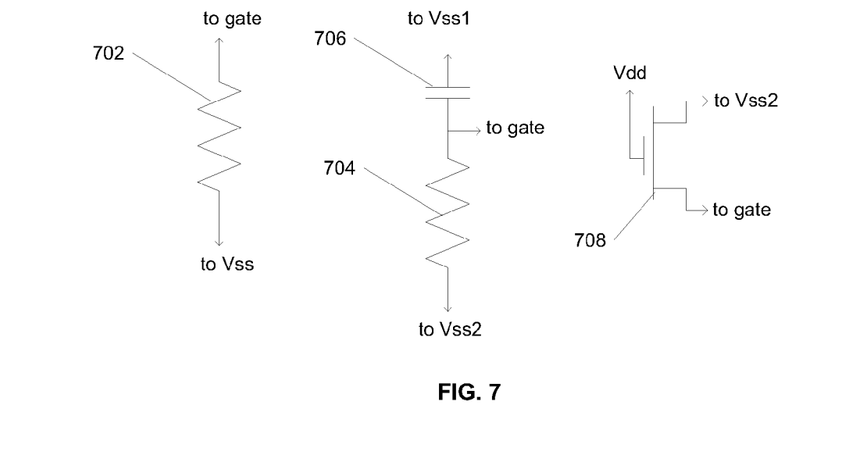
FIG. 7 is schematic drawings showing examples of a soft-pull-up unit circuit that can be included in the circuits of FIGS. 3, 4 and 5 according to other embodiments.

The circuits illustrated in FIG. 7 can act as soft pull-down circuits for use in signal delay units 305, 450b and 550b. Again, such a soft pull down circuit can comprise a single resistor 702, an RC circuit comprising resistor 704 and capacitor 706, or transmission gate 708. The operation principles of the circuits are similar to those described with respect to FIG. 6

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. An electrostatic discharge protection circuit, comprising:
    a first silicon controlled rectifier, comprising a first metal-oxide-semiconductor transistor, wherein a cathode of the first silicon controlled rectifier is coupled to a first power source, and an anode of the first silicon controlled rectifier is coupled to an electrostatic (ESD) bus;
    a second silicon controlled rectifier, comprising a second metal-oxide-semiconductor transistor, wherein an anode of the second silicon controlled rectifier is coupled to the first power source, a cathode of the second silicon controlled rectifier is coupled to the ESD bus, and both gates of the first and the second metal-oxide-semiconductor transistors are coupled to the first power source or ESD bus; and
    a parasitic diode, wherein a cathode of the parasitic diode is coupled to the first power source, and an anode of the parasitic diode is coupled to the ESD bus,
    wherein the first silicon controlled rectifier and the second silicon controlled rectifier are the same type, and the anodes of the first and second silicon controlled rectifiers are both disposed in the same well.

2. The electrostatic discharge protection circuit of claim 1, wherein the first power source is high power source, the first and the second metal-oxide-semiconductor transistors are P-type transistors, and the gates thereof are coupled to the first power source.

3. The electrostatic discharge protection circuit of claim 1, wherein the first source is low power source, the first and the second metal-oxide-semiconductor transistors are N-type transistors, and the gates thereof are coupled to the ESD bus.

4. The electrostatic discharge protection circuit of claim 2, further comprising a signal delay unit coupled between the first power source and the gate of the P-typed second metal-oxide-semiconductor transistor.

5. The electrostatic discharge protection circuit of claim 3, further comprising a signal delay unit coupled between the ESD bus and the gate of the N-type first metal-oxide-semiconductor transistor.

6. The electrostatic discharge protection circuit of claim 4, wherein the signal delay unit is composed of a resistor.

7. The electrostatic discharge protection circuit of claim 5, wherein the signal delay unit is composed of a resistor.

8. The electrostatic discharge protection circuit of claim 4, wherein the signal delay unit is composed of a resistor and a capacitor.

9. The electrostatic discharge protection circuit of claim 5, wherein the signal delay unit is composed of a resistor and a capacitor.

10. The electrostatic discharge protection circuit of claim 4, wherein the signal delay circuit unit is a transmission gate.

11. The electrostatic discharge protection circuit of claim 5, wherein the signal delay unit is a transmission gate.

12. The electrostatic discharge protection circuit of claim 2, further comprising a signal delay unit coupled between the first power source and the gates of the P-typed first and second metal-oxide-semiconductor transistor.

13. The electrostatic discharge protection circuit of claim 3, further comprising a signal delay unit coupled between the ESD bus and the gate of the N-type first and second metal-oxide-semiconductor transistor.

14. The electrostatic discharge protection circuit of claim 12, wherein the signal delay unit is composed of a resistor.

15. The electrostatic discharge protection circuit of claim 13, wherein the signal delay unit is composed of a resistor.

16. The electrostatic discharge protection circuit of claim 12, wherein the signal delay unit is composed of a resistor and a capacitor.

17. The electrostatic discharge protection circuit of claim 13, wherein the signal delay unit is composed of a resistor and a capacitor.

18. The electrostatic discharge protection circuit of claim 12, wherein the signal delay circuit unit is a transmission gate.

19. The electrostatic discharge protection circuit of claim 13, wherein the signal delay unit is a transmission gate.

* * * * *